US010367499B2

(12) United States Patent
Hoogzaad et al.

(10) Patent No.: US 10,367,499 B2
(45) Date of Patent: Jul. 30, 2019

(54) POWER SUPPLY READY INDICATOR CIRCUIT

(71) Applicant: NXP B.V., Eindhoven (NL)

(72) Inventors: Gian Hoogzaad, Mook (NL); Amin Hamidian, Nijmegen (NL); Fanfan Meng, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/026,129

(22) Filed: Jul. 3, 2018

(65) Prior Publication Data

US 2019/0068186 A1    Feb. 28, 2019

(30) Foreign Application Priority Data

Aug. 30, 2017    (EP) .................................... 17188639

(51) Int. Cl.
| | | |
|---|---|---|
| *H03L 7/00* | (2006.01) | |
| *H03K 5/22* | (2006.01) | |
| *H03K 17/22* | (2006.01) | |
| *G06F 1/28* | (2006.01) | |
| *G06F 11/30* | (2006.01) | |
| *G11C 5/14* | (2006.01) | |
| *G11C 7/20* | (2006.01) | |
| *G11C 17/18* | (2006.01) | |

(52) U.S. Cl.
CPC ............. *H03K 17/223* (2013.01); *G06F 1/28* (2013.01); *G06F 11/3055* (2013.01); *G06F 11/3058* (2013.01); *G11C 5/148* (2013.01); *G11C 7/20* (2013.01); *G11C 17/18* (2013.01)

(58) Field of Classification Search
CPC ........ H03K 5/24; H03K 5/2481; H03K 17/22; H03K 17/223; G01R 1/28; G01R 1/30; G01R 19/04; G01R 19/0038; G01R 19/145; G01R 19/165; G11C 7/06; G11C 7/062; G11C 7/065; G06F 1/24; G06F 1/26
See application file for complete search history.

(56) References Cited

U.S. PATENT DOCUMENTS

| | | | | |
|---|---|---|---|---|
| 4,611,295 | A * | 9/1986 | Fowler ............... | G05B 19/0428 307/132 E |
| 4,825,134 | A * | 4/1989 | Tracht .................. | B60S 1/0807 318/443 |
| 6,377,090 | B1 | 4/2002 | Bruno | |

(Continued)

FOREIGN PATENT DOCUMENTS

JP            5231393 B2      9/2009

*Primary Examiner* — An T Luu

(57) ABSTRACT

A power supply ready indicator circuit is described. The power supply ready indicator circuit includes a first power-supply-ready-input interfacing with a first power supply rail; a second power-supply-ready-input interfacing with a second power supply rail; and a power ready indicator output. The power supply ready indicator circuit is configured to divide the voltage on the first power supply rail, and to compare the divided voltage with the second power supply rail voltage. The power supply ready indicator circuit generates a power ready signal on the power ready indicator output in response to the divided voltage value being greater than the second power supply rail voltage value. The final value of the first power supply rail voltage is greater than the final value of the second power supply rail voltage.

15 Claims, 5 Drawing Sheets

(56) References Cited

U.S. PATENT DOCUMENTS

| | | | | |
|---|---|---|---|---|
| 7,684,223 B2* | 3/2010 | Wei | ............... | H02M 1/10 |
| | | | | 363/143 |
| 8,415,993 B1* | 4/2013 | Newman | ............... | H03L 5/00 |
| | | | | 327/142 |
| 8,531,194 B2* | 9/2013 | Edwards | ............ | G01R 31/3004 |
| | | | | 324/713 |
| 8,531,215 B2* | 9/2013 | Morino | ............... | H03K 17/22 |
| | | | | 327/143 |
| 8,723,554 B2* | 5/2014 | Zanchi | ............... | H03K 5/2445 |
| | | | | 327/77 |
| 9,397,654 B2 | 7/2016 | Lou | | |
| 2007/0250721 A1 | 10/2007 | Searles et al. | | |
| 2010/0045347 A1 | 2/2010 | Lee et al. | | |
| 2012/0112816 A1 | 5/2012 | Wang et al. | | |

* cited by examiner

300

350

POWER SUPPLY READY INDICATOR CIRCUIT

CROSS-REFERENCE TO RELATED APPLICATIONS

This application claims the priority under 35 U.S.C. § 119 of European patent application no. 17188639.3, filed Aug. 30, 2017 the contents of which are incorporated by reference herein.

FIELD

This disclosure relates to a power supply ready indicator circuit.

BACKGROUND

During start-up of an integrated circuit, it may be necessary for some of the analog and digital circuitry to function while the power supplies are ramping up. For example, it may be required to access registers for example in one-time programmable (OTP) memory. OTP memory and control logic includes analog and digital circuitry which must perform reliably during the start-up phase of the integrated circuit. Reliable operation of digital circuitry often requires the use of a power-on-reset circuit. The power-on-reset circuit typically generates a signal that typically asynchronously resets the flipflops in a digital core. The digital logic is reset before the supply voltage level reaches the final value. A power supply ready indicator circuit may also be used to indicate that the power supply is ready for the analog circuits to operate. The power supply ready indicator circuit is implemented using similar circuitry to the power-on-reset and also triggers before the supply voltage reaches the final value.

SUMMARY

Various aspects of the disclosure are defined in the accompanying claims. In a first aspect there is provided a power supply ready indicator circuit comprising a first power-supply-ready-input coupled to a first power supply rail; a second power-supply-ready-input coupled to a second power supply rail; a power ready indicator output; wherein the power supply ready indicator circuit is configured to divide the voltage on the first power supply rail, compare the divided voltage with the second power supply rail voltage, and generate a power ready signal on the power ready indicator output in response to the divided voltage value being greater than the second power supply rail voltage value, wherein the final value of the first power supply rail voltage is greater than the final value of the second power supply rail voltage.

In one or more embodiments, the power supply ready indicator circuit may further comprise a voltage divider having an input coupled to the first power-supply-ready-input and a voltage divider output; a comparator having a first comparator input coupled to the second power-supply-ready-input, a second input coupled to the voltage divider output, and an output coupled to the power ready indicator output; wherein the comparator is configured to generate the power ready signal in response to the voltage at the voltage divider output exceeding the voltage at the second power-supply-ready-input.

In one or more embodiments, the voltage divider may have a further input coupled to the power ready indicator output and wherein the voltage divider is configured to increase the divided voltage value in response to the power read indication signal being generated.

In one or more embodiments, the voltage divider may comprise a series arrangement of at least one diode, a first resistor and a second resistor arranged between the first power supply-ready-input and a ground supply rail, wherein the voltage divider output is connected to a common node of the first resistor and second resistor.

In one or more embodiments, the voltage divider may further comprise a capacitor arranged in parallel with the second resistor.

In one or more embodiments, the voltage divider may further comprise a third resistor arranged in series with the second resistor and a ground supply rail, and a transistor arranged in parallel with the third resistor, wherein the control terminal of the transistor is coupled to the power ready indicator output and wherein the transistor is configured to short the third resistor until the power ready indicator is generated.

In one or more embodiments, the transistor is an NMOS transistor having a source connected to the ground supply rail, and a drain connected to the common node between the second resistor and the third resistor and wherein the power supply ready indicator circuit further comprises an inverter having an input coupled to the power ready indicator output and an output coupled to the gate of the transistor.

In one or more embodiments, the power supply ready indicator circuit, may be included in an integrated circuit further comprising a voltage regulator having an input coupled to the first power supply rail and an output coupled to the second power supply rail, wherein the voltage regulator is configured to generate the second power supply rail voltage.

In one or more embodiments, the integrated circuit may further comprise a power-on reset circuit coupled to the voltage regulator output.

In one or more embodiments, in response to power being applied, the power-on reset circuit may generate a reset before the power supply indicator signal is generated.

In one or more embodiments, the integrated circuit may further comprise digital circuitry coupled to the power-on-reset circuit, the power ready circuit output, wherein the digital circuitry is configured to be supplied by the voltage regulator output.

In one or more embodiments, the integrated circuit may further comprise further circuitry coupled to the digital circuitry, wherein the further circuitry comprises analog circuitry and is configured to be supplied by the voltage regulator output.

In one or more embodiments, the integrated circuit may further comprise a one-time programmable memory and wherein the integrated circuit is configured on power up to apply a reset to the digital circuitry and in response to the power indicator ready indication signal being asserted to read the content of the one-time programmable memory.

In a second aspect there is described a method of generating a power ready indicator signal after power is applied, the method comprising: dividing a first supply rail voltage; comparing the divided supply rail voltage with a second supply rail voltage; and generating a power ready signal in response to the divided supply rail voltage value being greater than the voltage regulator output voltage, wherein the final value of the first power supply rail voltage is greater than the final value of the second power supply rail voltage.

In one or more embodiments, the method may further comprise applying power to the first power supply rail;

generating a power-on-reset at a first output voltage level from the second power supply rail; and generating the power ready signal at a second higher output voltage level from the from the second power supply rail.

BRIEF DESCRIPTION OF DRAWINGS

In the figures and description like reference numerals refer to like features. Embodiments are now described in detail, by way of example only, illustrated by the accompanying drawings in which.

DESCRIPTION

Figure 1A:
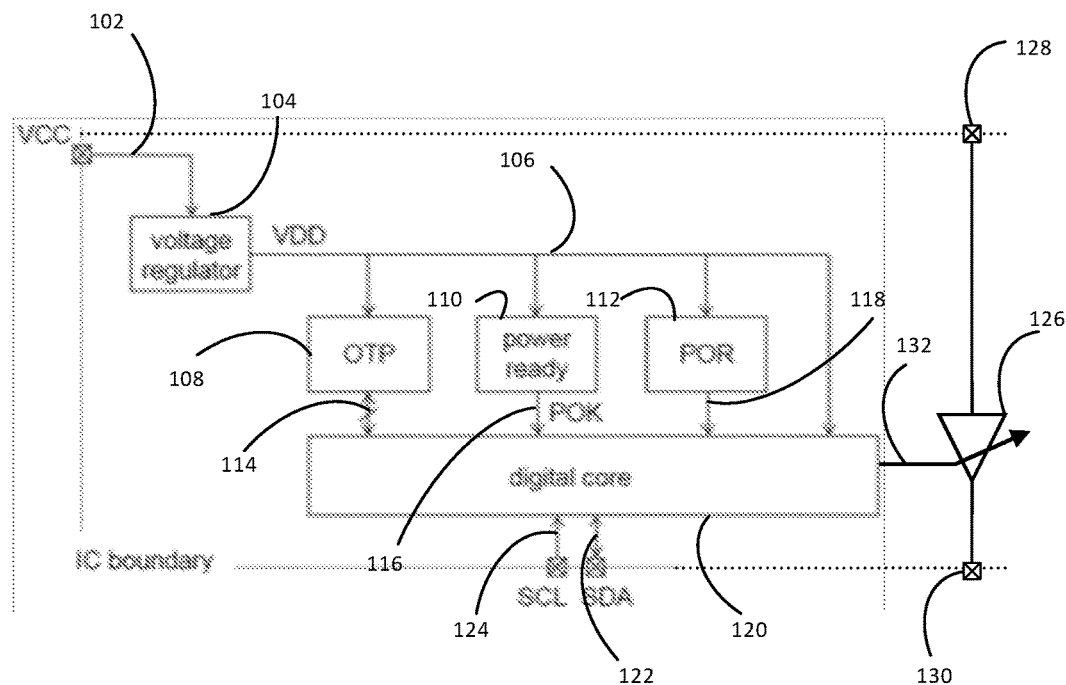
FIG. 1A shows a low noise amplifier integrated circuit including a typical power supply ready circuit.

FIG. 1A shows a base station low noise amplifier (LNA) integrated circuit including start-up circuitry 100. The integrated circuit 100 includes a voltage regulator 104, a one-time programmable (OTP) memory 108, a power supply ready indicator circuit 110, a power-on-reset (POR) circuit 112, a digital logic core 120 including an I2C interface connected to serial clock input SCL 124 and bidirectional serial data connection SDA 122, and a low noise amplifier 126. A first power supply rail 102 is supplied with a first voltage VCC. The first power supply rail is connected to the voltage regulator 104 which supplies a second voltage VDD. The output of the voltage regulator 104 is connected to a second supply rail 106. The second power rail 106 is connected to the OTP memory 108, the power supply ready indicator circuit 110, the power-on-reset circuit 112 and the digital core 120. The POR output 118 is connected to the digital core 120. The power ready output (POK) 116 is connected to the digital core 120. The OTP memory 108 is connected to the digital core 120 via the bus connection 114. The low noise amplifier 126 has an input connected to RF input pin 128 and an output connected to RF output pin 130. The digital core 120 may control the gain of the low noise amplifier via gain control output 132 which is connected to a gain control input of the low noise amplifier 126.

The gain of each instance of the integrated circuit 100 is written to the OTP memory during a calibration process. When incorporated into the final system, such as a base station, the LNA integrated circuit 100 may transfer this information into registers which may be accessed during initialization via the I2C interface. Consequently, at some point in time during start-up the OTP memory cells are read and stored in registers.

The first voltage, denoted VCC, is typically the voltage supplied by the system and may have a typical value of for example 5 volts. The on-chip voltage regulator 104 generates a suitable voltage for the CMOS gates in the digital core, for example 2.5 volts. The POR circuit 112 outputs a reset pulse, for example typically when VDD=1.5V. The OTP memory 108 contains the memory elements such as poly-fuses (not shown) and the read/write/support circuitry (not shown) such that it can interface at digital levels with the digital core 120. The digital core 120 can communicate with the remainder of the system through the I2C serial interface with SCL 124 and SDA 122 lines. The power supply ready indicator circuit 110 generates a power OK signal (POK) on power ready output 116 to signal to the digital core 120 when the OTP memory 108 is ready. Hence, the power ready circuit 110 is connected to the second supply rail 106 which is the same supply as the OTP memory 108. Once the digital core 120 receives the power ready signal, the OTP 108 is instructed to read out the memory via the bus 114. When the OTP 108 receives the instruction, the OTP 108 will start an oscillator and bias circuits (not shown). The oscillator clocks the sequencing of accessing the memory cells. The bias circuits provide currents for the poly-fuses (not shown) and for comparators (not shown) that can determine relative to a reference voltage whether the poly-fuse is fused or unfused. Consequently, during the read-out because of the current drawn by the different circuits in the OTP 108, the second supply rail 106 is relatively heavily loaded. This read-out occurs at the same time the OTP comparators are used to determine the logical state of an OTP memory cell dependent in differences in the order of a few millivolts.

The power supply ready indicator circuit 110 has a similar design to the POR circuit 112. By design the trip-point can be set higher compared to the 1.5 Volts of the POR 112. However, because of several spread sources such as process, temperature, and ageing, about 1.9V is the maximum for a maximum supply voltage of 2.5 volts. In practice including hysteresis the maximum power-ready voltage is about 1.7V. The OTP circuitry 108 needs to be designed to work correctly at 1.7V, when the second rail supply voltage VDD is 2.5V. This can have a negative impact on circuit accuracies and error margins for example in the comparator in the OTP 108. Furthermore, the voltage regulator 104 typically clews during ramp up, hence it has very limited loop gain. Consequently, the output voltage VDD on the second supply rail 106 is not regulated. This may mean that the second supply rail 106 is susceptible to loading since it is being loaded by the OTP circuitry 108. This loading may result in large voltage spikes, typically greater than 100 mV, which may affect the reliable operation of the OTP circuitry 108.

Figure 1B:
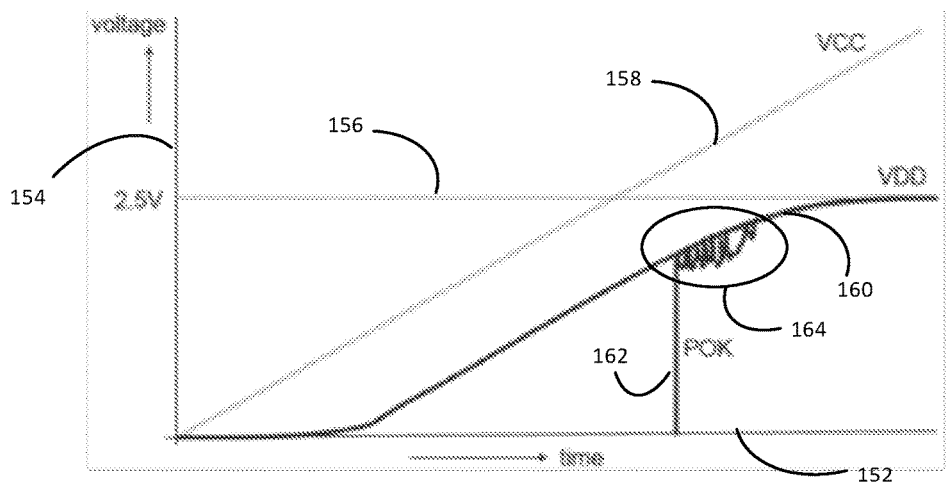
FIG. 1B Illustrates the behaviour of the supply voltages and the power supply ready indicator circuit of FIG. 1A.

FIG. 1B shows a plot 150 of the supply voltage change on the Y-axis 154 versus time on the X-axis 152 for the first supply rail 102 and the second supply rail 106. The lines 158 shows the increase in the value of VCC on first supply rail 102. Line 160 shows the variation of VDD on second supply rail 106 up to its final stable value of 2.5 volts indicated by the dotted line 156. The power OK status indicator (POK) signal is asserted at time indicated by line 162 when VDD is approximately 1.7 volts. The noise region 164 occurring on the second supply rail 160 after the POK signal is due to the OTP circuitry 108 loading an unregulated supply. The power OK signal (not shown) on power ready output 116 will have the same noise. The POR output signal on POR output 118 is not shown, but is typically asserted before the POK signal at a slightly lower voltage, for example 1.5 volts. To avoid the problems above, the digital core 120 may wait a certain amount of time after the POK signal is asserted before commanding the OTP to read out mode. However, the time scale shown in FIG. 1B depends on the ramp-up of VCC on the first supply rail 102, which is defined in the application and unknown a-priori to the LNA integrated circuit 100.

Figure 2A:
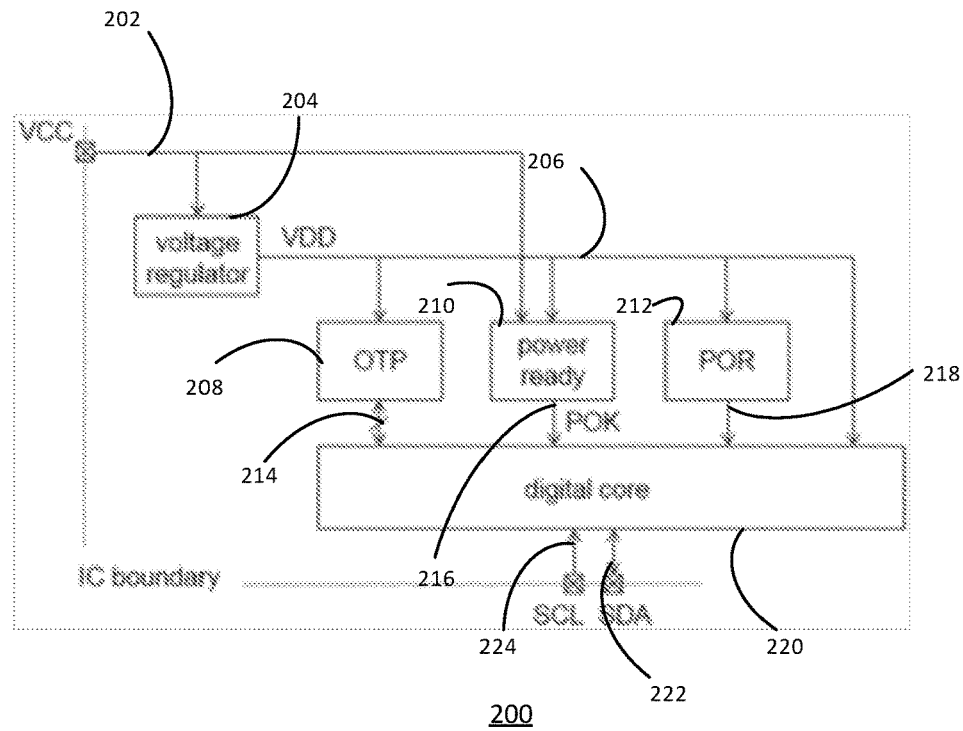
FIG. 2A shows an integrated circuit including a power supply ready circuit according to an embodiment.

FIG. 2A shows an integrated circuit 200 including a power supply ready indicator circuit 210 according to an embodiment. The integrated circuit 200 includes a voltage regulator 204, a one-time programmable (OTP) memory 208, a power ready indicator 210, a power-on-reset (POR) circuit 212, and a digital logic core 220 including an I2C interface connected to serial clock input SCL 224 and bidirectional serial data connection SDA 222. A first power supply rail 202 is supplied with a first voltage VCC. The first power supply rail 202 is connected to the voltage regulator 204 and is supplied with a second voltage VDD which has a final value lower than the first voltage. The first power rail 202 is connected to the power ready circuit 210. The output of the voltage regulator 204 is connected to a second supply rail 206. The second power rail 206 is connected to the OTP memory 208, the power supply ready indicator circuit 210, the power-on-reset circuit 212 and the digital core 220. The POR output 218 is connected to the digital core 220. The power ready output (POK) 216 is connected to the digital core 220. The OTP memory 208 is connected to the digital core 220 via the bus connection 214.

Because the power ready circuit 210 is connected to both the first supply rail 202 and the second supply rail 206, the power ready circuit 210 may use the higher supply voltage VCC from the first supply rail 202 to generate a trigger point only when the voltage VDD of the second supply rail 206 has reached the stable value.

Figure 2B:
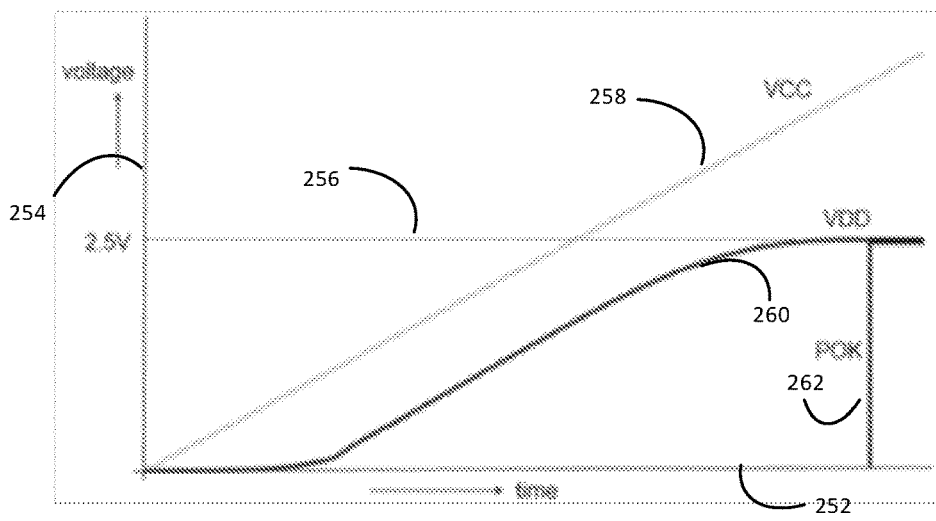
FIG. 2B Illustrates the behaviour of the supply voltages and the power supply ready indicator circuit of FIG. 2A.

FIG. 2B shows a plot 250 of the expected supply voltage change on the Y-axis 254 versus time on the X-axis 252 for the first supply rail 202 and the second supply rail 206. The line 258 shows the increase in the value of VCC on first supply rail 202. Line 260 shows the variation of VDD on second supply rail 206 up to its final stable value of 2.5 volts indicated by the dotted line 256. The trigger point of the power status indicator (POK) is shown by line 262 and now occurs when VDD is at its final (stable) value. By triggering the power ready indicator when VDD is stable, the full supply voltage instead of only a fraction of it can be used when designing the analog circuits. When lower voltages are used resulting in less voltage headroom, the accuracy of the circuit and circuit impedances may need to be increased resulting in an increase in silicon area. For example, existing devices may need to be made larger so that process variations in manufacture do not cause unacceptable variations in the performance of the device. Alternatively, extra devices or circuitry may be added in series or parallel. Adding extra devices or circuitry typically also increases the power dissipation. By using the full supply voltage, the analog circuitry may be implemented with reduced silicon area. In addition, by using the full supply voltage with more voltage headroom, more reliable operation may be achieved for circuits such as OTP memories resulting in, for example, a lower bit read failure rate. Furthermore, as the supply is in regulation, loading the second supply rail may not affect the stable output voltage, and the influence of the VCC supply noise on the stable output voltage may be reduced. Consequently, a relatively small proportion of the error budget is used by the power supply noise.

Figure 3A:
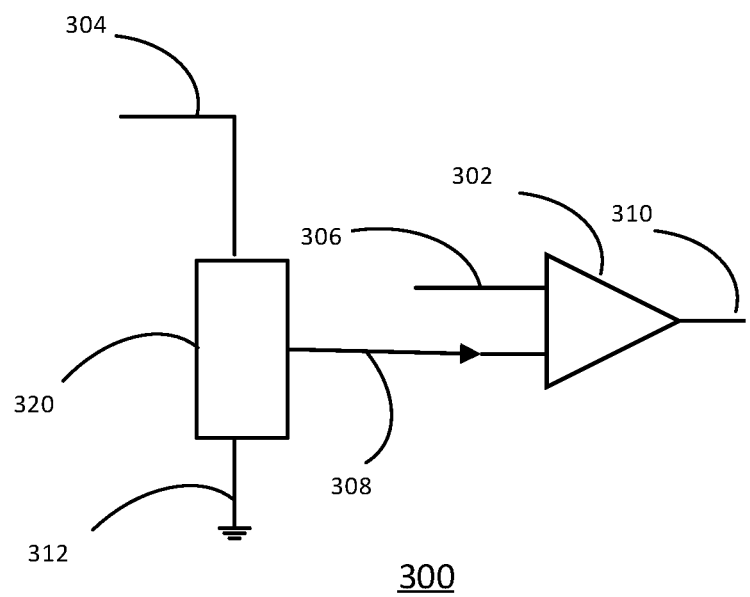
FIG. 3A shows a power supply ready indicator circuit according to an embodiment.

FIG. 3A shows a power supply ready indicator circuit 300 according to an embodiment. Power supply ready indicator circuit 300 includes a voltage divider 320 and a comparator 302. A first power-supply-ready-input 304 is connected to a first terminal of the voltage divider 320. A ground input 312 may be connected to a second terminal of the voltage divider 320. Voltage divider output 308 may be connected to a first input of the comparator 302. A second power-supply-ready-input 306 may be connected to a second input of the comparator 302. The output of the comparator 302 may be connected to a power ready indicator output 310. In operation, the first power-supply-ready-input 304 may be connected to a first power supply having a first final voltage. The second power-supply-ready-input 306 may be connected to a second power supply having a second final voltage which is less than the first final voltage. In some examples, the second power supply may be supplied by a voltage regulator which in turn is supplied by the first power supply. In operation, the power supply ready indicator circuit 300 receives a respective first and second supply voltage on each of the first power-supply-ready-input and the second power-supply-ready-input. The second lower supply voltage may be supplied from a regulator which has its input coming from the first higher supply voltage. The voltage divider circuit 320 outputs a threshold voltage on the voltage divider output 308 that lags in time compares to the second lower supply voltage during a start-up phase when the power supplies are ramping up but eventually exceeds the second lower supply voltage. The comparator 302 compares the threshold voltage with the second supply voltage and generates a power ready signal when the threshold voltage exceeds the second supply voltage. The voltage divider circuit 320 may be implemented using active or passive components.

The power supply ready indicator circuit 300 does not generate a reference from the supply voltage which is used to power the circuitry on the integrated circuit, in contrast to power indication circuits based on POR circuitry. Instead, a first reference is generated from another source, typically one power supply "before" the normal supply VDD, which in examples described herein may be denoted as VCC. This first reference is then compared with a second reference which is the second supply voltage denoted VDD.

Figure 3B:
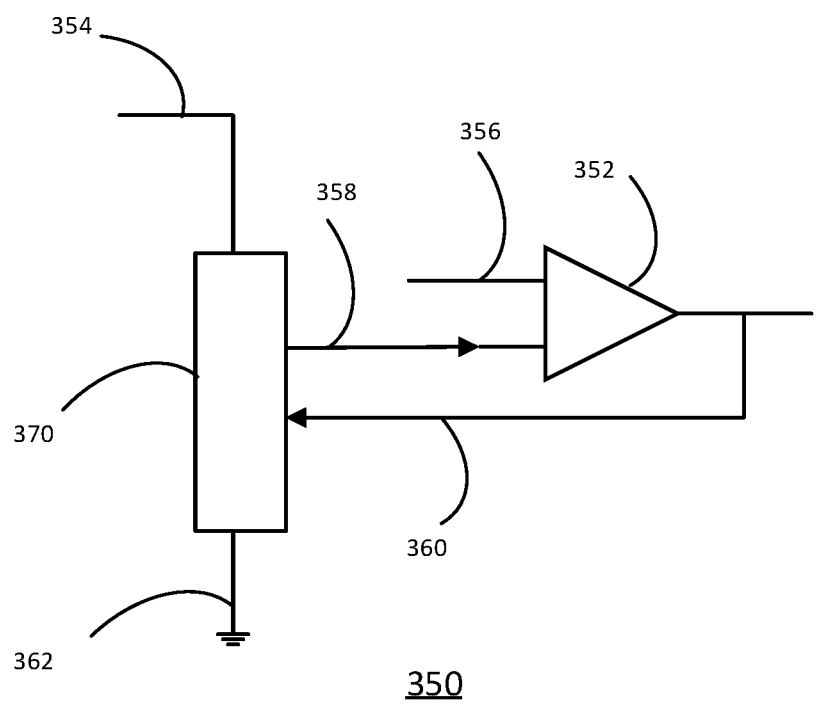
FIG. 3B shows a power supply ready indicator circuit according to an embodiment.

FIG. 3B shows a power supply ready indicator circuit 350 according to an embodiment. Power supply ready indicator circuit 350 includes a voltage divider 370 and a comparator 352. A first power-supply-ready-input 354 is connected to a first terminal of the voltage divider 370. A ground input 362 may be connected to a second terminal of the voltage divider 370. Voltage divider output 358 is connected to a first input of the comparator 352. A second power-supply-ready-input 356 may be connected to a second input of the comparator 352. The output of the comparator 352 may be connected to a power ready indicator output 360. The power ready indicator output 360 may be connected to a control input of the voltage divider 370. In operation, the first power-supply-ready-input 354 may be connected to a first power supply having a first final voltage. The second power-supply-ready-input 356 may be connected to a second power supply having a second final voltage which is less than the first final voltage. In operation, the power supply ready indicator circuit 350 receives a respective first and second supply voltage on each of the first power-supply-ready-input and the second power-supply-ready-input. The second lower supply voltage may be supplied from a regulator which has its input coming from the first higher supply voltage. The voltage divider circuit 370 may output a threshold voltage on the voltage divider output 358 that lags in time compares to the lower supply voltage during a start-up phase when the power supplies are ramping up but eventually exceeds the second lower supply voltage. The comparator 352 compares the threshold voltage with the second supply voltage and generates a power ready signal when the threshold voltage exceeds the second supply voltage. Once the power ready signal has been generated or asserted, the voltage divider 352 may increase the threshold voltage value to ensure that the power ready signal remains stable. This may be done for example by altering the divider resistance ratio between the first power-supply-ready-input 354 and the ground connection 362. Increasing the threshold voltage value in this way adds hysteresis to the circuit which may ensure that the circuit is stable around the trigger point.

Figure 4A:
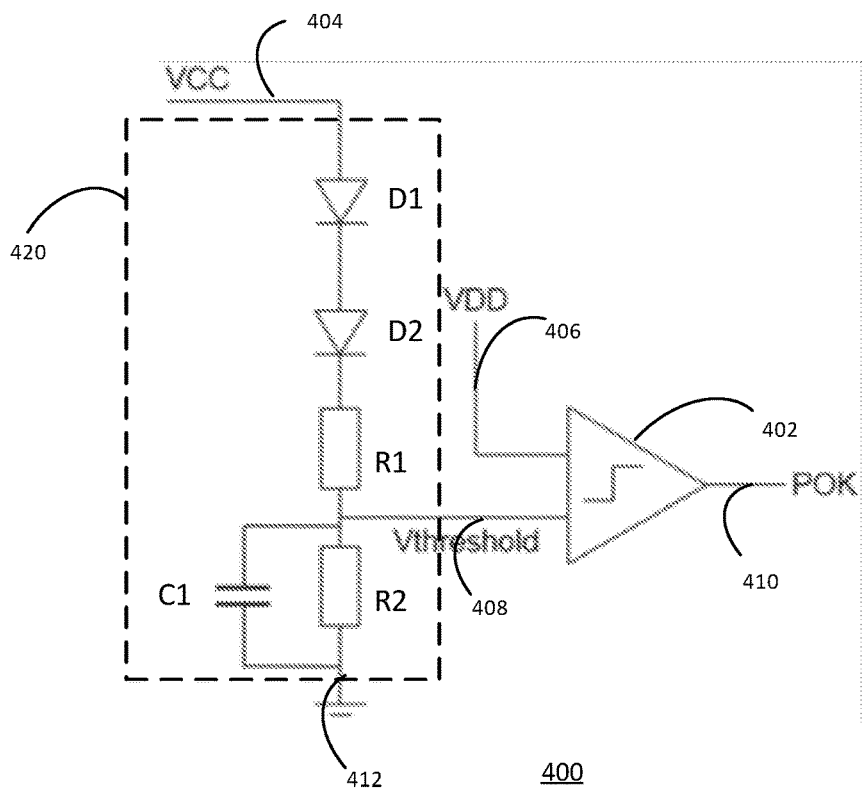
FIG. 4A shows a power supply indicator circuit according to an embodiment.

FIG. 4A shows a power supply ready indicator circuit 400 according to an embodiment. Power supply ready indicator circuit 400 includes a voltage divider 420 and a comparator 402. The voltage divider 420 includes a series arrangement of a first diode D1, a second diode D2, a first resistance R1 and a second resistance R2 arranged between the first power-supply-ready-input 404 and the ground terminal 412. The voltage divider 420 includes a capacitance C1 connected in parallel with the second resistance R2. The capacitance C1 has a first terminal connected to a common node between the first resistance R1 and the second resistance R2, and a second terminal connected to the ground terminal 412. The voltage divider output 408 is connected to the common node between the first resistance R1 and the second resistance R2. The voltage divider output 408 is connected to a first input of the comparator. A second power-supply-ready-input 406 is connected to a second input of the comparator 402. The output of the comparator 402 is connected to the power ready indicator output 410.

In operation, the first power-supply-ready-input 404 may be connected to a first power supply having a first final voltage. The second power-supply-ready-input 406 may be connected to a second power supply having a second final voltage which is less than the first final voltage. In operation, the power supply ready indicator circuit 400 receives a respective first and second supply voltage on each of the first power-supply-ready-input 404 and the second power-supply-ready-input 406. The second lower supply voltage may be supplied from a regulator which has its input coming from the first higher supply voltage. The voltage divider circuit 420 may output a threshold voltage on the voltage divider output 408 that lags in time compares to the lower supply voltage during a start-up phase when the power supplies are ramping up but eventually exceeds the second lower supply voltage. Diodes D1 and D2 keep the threshold voltage low during initial ramp up as the threshold voltage will not start to increase until the voltage VCC on the first power-supply-ready-input 404 is at least two diode forward drop voltages. The diodes D1 and D2 may ensure that the threshold voltage lags the voltage on the second power-supply-ready-input 406. In other examples, only a single diode may be used. The capacitance C1 may also keep the threshold voltage low during initial ramp up by providing a relatively low initial impedance path to ground 412 from the voltage divider output 408. Resistances R1 and R2 are chosen so that the final value of the threshold voltage, Vthreshold, is always greater than the final voltage of VDD on the second power-supply-ready-input 406. The comparator 402 compares the threshold voltage with the second supply voltage and generates a power ready signal when the threshold voltage exceeds the second supply voltage.

Figure 4B:
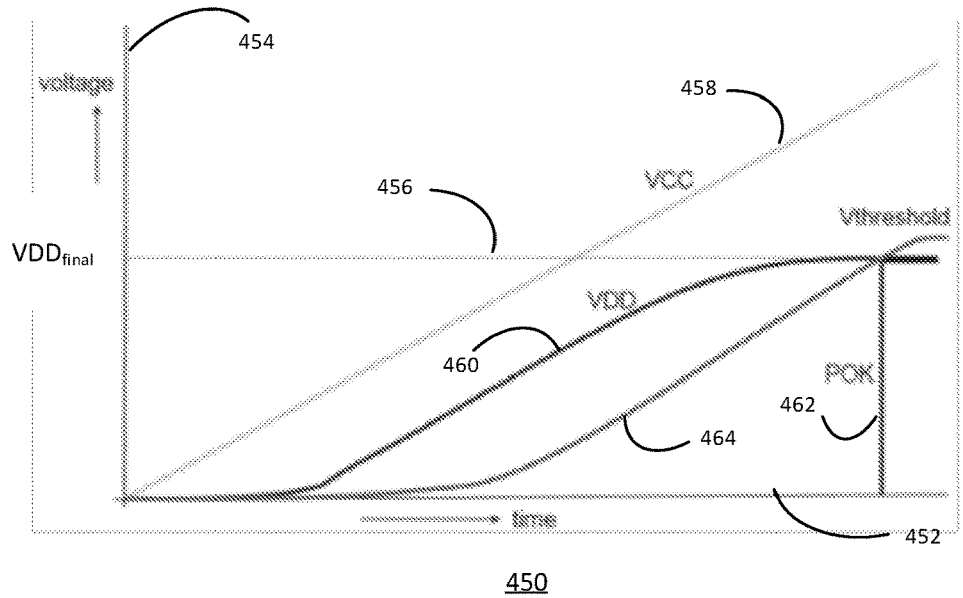
FIG. 4B illustrates the behaviour of the supply voltages and the power supply ready indicator circuit of FIG. 4A.

FIG. 4B shows a plot 450 of the expected supply voltage change on the Y-axis 454 versus time on the X-axis 452 for the first supply rail 404 and the second supply rail 406. The line 458 shows the increase in the value of VCC on first supply rail 404. Line 460 shows the variation of VDD on second supply rail up to its final stable value of $VDD_{final}$ indicated by the dotted line 456. Line 464 indicates the variation of the threshold voltage with time. The power supply ready indicator circuit 400 only triggers the power ready indicator output 410 at a time indicated by line 462 when the second supply voltage VDD is stable and at the point where line 464 crosses line 460. Consequently, the full supply voltage instead of only a fraction of it can be used when designing the analog circuits. Furthermore, as the supply is in regulation, loading the second supply rail may not affect the stable output voltage, and the influence of the VCC supply noise on the stable output voltage may be reduced.

Figure 5:
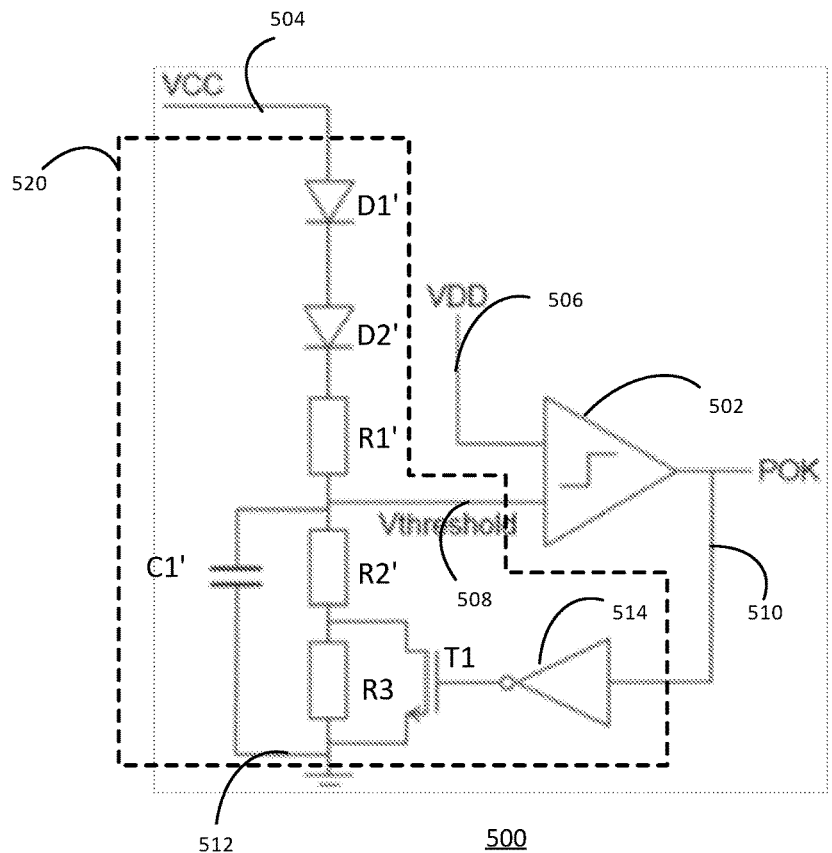
FIG. 5 shows a power supply indicator circuit according to an embodiment.

FIG. 5 shows a power supply ready indicator circuit 500 according to an embodiment. Power supply ready indicator circuit 500 includes a voltage divider 520 and a comparator 502. The voltage divider 520 includes a series arrangement of a first diode D1', a second diode D2', a first resistance R1', a second resistance R2', and a third resistance R3 between the first power-supply-ready-input 504 and the ground terminal 512. The voltage divider 520 includes a capacitance C1' connected in parallel with the second resistance R2' and third resistance R3. The capacitance C1' may have a first terminal connected to a common node between the first resistance R1' and the second resistance R2', and a second terminal connected to the ground terminal 512. An NMOS transistor T1 has a source connected to the ground terminal 512 and a drain connected to the common node between resistances R2' and R3. NMOS transistor T1 has a gate connected an output of an inverter 514. The input of the inverter 514 may be connected to the power ready indicator output 510. The voltage divider output 508 is connected to the common node between the first resistance R1 and the second resistance R2. The voltage divider output 508 is connected to a first input of the comparator. A second power-supply-ready-input 506 is connected to a second input of the comparator 502. The output of the comparator 502 is connected to the power ready indicator output 510.

In operation, the first power-supply-ready-input 504 may be connected to a first power supply having a first final voltage. The second power-supply-ready-input 506 may be connected to a second power supply having a second final voltage which is less than the first final voltage. In operation, the power supply ready indicator circuit 500 receives a respective first and second supply voltage on each of the first power-supply-ready-input 504 and the second power-supply-ready-input 506. The second lower supply voltage may be supplied from a regulator which has its input coming from the first higher supply voltage. The voltage divider circuit 520 may output a threshold voltage on the voltage divider output 508 that lags in time compares to the lower supply voltage during a start-up phase when the power supplies are ramping up but eventually exceeds the second lower supply voltage.

Diodes D1' and D2' keep the threshold voltage low during initial ramp up as the threshold voltage will not start to increase until the voltage VCC on the first power-supply-ready-input 504 is at least two diode forward drop voltages. The diodes D1' and D2' may ensure that the threshold voltage lags the voltage on the second power-supply-ready-input 506. In other examples, only a single diode may be used. The capacitance C1' may also keep the threshold voltage low during initial ramp up by providing a relatively low initial impedance path to ground 512 from the voltage divider output 508. Resistances R1' and R2' are chosen so that the final value of the threshold voltage, Vthreshold, is always greater than the final voltage of VDD on the second power-supply-ready-input 506. The comparator 502 compares the threshold voltage with the second supply voltage and generates a power ready signal when the threshold voltage exceeds the second supply voltage. Transistor T1 is switched on initially which may effectively short circuit third resistance R3. Once the power ok (POK) signal is asserted on power ready indicator output 510, the transistor T1 is switched off. Switching off transistor T1 increases the resistance between the voltage divider output 508 and ground 512 which increases the threshold voltage. This increase in threshold voltage effectively adds hysteresis to the circuit and helps ensure that the power supply ready indicator circuit 500 is stable around the trigger point of the power ok signal. In other examples, different transistors may be used, for example Bipolar transistors.

It will be appreciated that any of the power supply ready indicator circuits 300, 350, 400, 500 may be used to implement the power supply ready indicator circuit 210 in the integrated circuit 200. Power supply ready indicator circuits described herein may be used in any integrated circuit, particularly where critical tasks such as calibration are performed at start up. Embodiments of the power supply ready indicator circuit may be included in integrated circuits used in systems such as space-constrained sensor applications. In such applications, the digital circuits may require a stable regulated supply voltage before starting operation.

Figure 6:
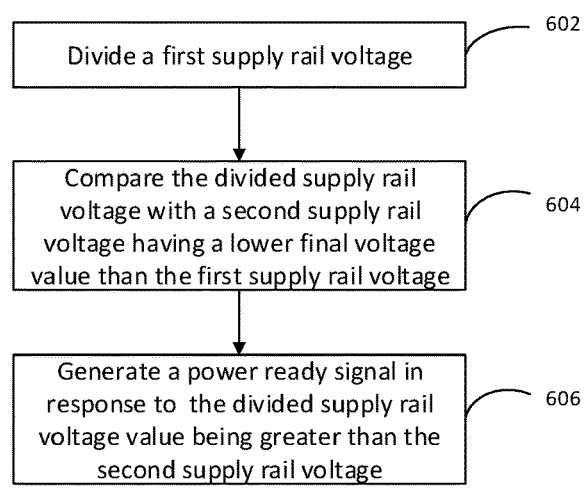
FIG. 6 Illustrates a method of generating a power supply ready indicator according to an embodiment.

FIG. 6 shows a method of generating a power ready indicator signal after power is applied 600. In step 602 a first supply rail voltage is divided. In step 604, the divided supply rail voltage is compared with a second supply rail voltage having a lower final voltage value than the first supply rail voltage. In step 606 a power ready signal is generated in response to the divided supply rail voltage value being greater than the second supply rail voltage.

A power supply ready indicator circuit is described. The power supply ready indicator circuit includes a first power-supply-ready-input coupled to a first power supply rail; a second power-supply-ready-input coupled to a second power supply rail; and a power ready indicator output. The power supply ready indicator circuit is configured to divide the voltage on the first power supply rail, and to compare the divided voltage with the second power supply rail voltage. The power supply ready indicator circuit generates a power ready signal on the power ready indicator output in response to the divided voltage value being greater than the second power supply rail voltage value. The final value of the first power supply rail voltage is greater than the final value of the second power supply rail voltage. The power supply ready indicator circuit is triggered only when the supply voltage is at the final stable value.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A power supply ready indicator circuit comprising:
 a first power-supply-ready-input coupled to a first power supply rail;
 a second power-supply-ready-input coupled to a second power supply rail;
 a power ready indicator output;
 wherein the power supply ready indicator circuit is configured to:
  divide a voltage on the first power supply rail,
  compare the divided voltage with the second power supply rail voltage, and
  generate a power ready signal on the power ready indicator output in response to the divided voltage being greater than the second power supply rail voltage,
 wherein a final value of the first power supply rail voltage is greater than a final value of the second power supply rail voltage;
 an integrated circuit including the power supply ready indicator circuit;
 wherein the integrated circuit includes a voltage regulator having an input coupled to the first power supply rail and an output coupled to the second power supply rail; and
 wherein the voltage regulator is configured to generate the second power supply rail voltage.

2. The power supply ready indicator circuit of claim 1 further comprising
 a voltage divider having an input coupled to the first power-supply-ready-input and a voltage divider output;
 a comparator having a first comparator input coupled to the second power-supply-ready-input, a second input coupled to the voltage divider output, and an output coupled to the power ready indicator output;
 wherein the comparator is configured to generate the power ready signal in response to the voltage at the voltage divider output exceeding the voltage at the second power-supply-ready-input.

3. The power supply ready indicator circuit of claim 2 wherein the voltage divider has a further input coupled to the power ready indicator output and wherein the voltage divider is configured to increase the divided voltage value in response to the power read indication signal being generated.

4. The power supply ready indicator circuit of claim 2 wherein the voltage divider comprises:
 a series arrangement of at least one diode, a first resistor and a second resistor arranged between the first power-supply-ready-input and a ground supply rail,
 wherein the voltage divider output is connected to a common node of the first resistor and second resistor.

5. The power supply ready indicator circuit of claim 4 wherein the voltage divider further comprises a capacitor arranged in parallel with the second resistor.

6. The power supply ready indicator circuit of claim 4 wherein the voltage divider further comprises a third resistor arranged in series with the second resistor and a ground supply rail, and a transistor arranged in parallel with the third resistor,
wherein the control terminal of the transistor is coupled to the power ready indicator output and
wherein the transistor is configured to short the third resistor until the power ready indicator is generated.

7. The power supply ready indicator circuit of claim 6 wherein the transistor is an NMOS transistor having a source connected to the ground supply rail, a drain connected to the common node between the second resistor and the third resistor and
wherein the power supply ready indicator circuit further comprises an inverter having an input coupled to the power ready indicator output and an output coupled to the gate of the transistor.

8. The integrated circuit of claim 1:
further comprising a power-on reset circuit coupled to the voltage regulator output.

9. The integrated circuit of claim 8
wherein in response to power being applied, the power-on reset circuit generates a reset before the power supply indicator signal is generated.

10. The integrated circuit of claim 1:
further comprising digital circuitry coupled to the power-on-reset circuit, and the power ready circuit output,
wherein the digital circuitry is configured to be supplied by the voltage regulator output.

11. The integrated circuit of claim 10
further comprising further circuitry coupled to the digital circuitry,
wherein the further circuitry comprises analog circuitry and is configured to be supplied by the voltage regulator output.

12. The integrated circuit of claim 11
wherein the further circuitry comprises a one-time programmable memory and
wherein the integrated circuit is configured on power up to apply a reset to the digital circuitry and in response to the power indicator ready indication signal being asserted to read the content of the one-time programmable memory.

13. A method of generating a power ready indicator signal after power is applied, the method comprising:
dividing a first supply rail voltage;
comparing the divided supply rail voltage with a second supply rail voltage;
and generating a power ready signal in response to the divided supply rail voltage being greater than the second supply rail voltage, wherein a final value of the first power supply rail voltage is greater than a final value of the second power supply rail voltage;
applying power to the first power supply rail;
generating a power-on-reset at a first output voltage level from the second power supply rail; and
generating the power ready signal at a second higher output voltage level from the from the second power supply rail.

14. The method of claim 13:
wherein the second power supply voltage is provided by an output of a voltage regulator having an input coupled to receive the first power supply rail voltage; and
wherein the voltage regulator is configured to generate the second power supply rail voltage.

15. A power supply ready indicator circuit comprising:
a first power-supply-ready-input coupled to a first power supply rail;
a second power-supply-ready-input coupled to a second power supply rail;
a power ready indicator output;
wherein the power supply ready indicator circuit is configured to:
divide a voltage on the first power supply rail,
compare the divided voltage with the second power supply rail voltage, and
generate a power ready signal on the power ready indicator output in response to the divided voltage being greater than the second power supply rail voltage,
wherein a final value of the first power supply rail voltage is greater than a final value of the second power supply rail voltage;
a voltage divider having an input coupled to the first power-supply-ready-input and a voltage divider output;
a comparator having a first comparator input coupled to the second power-supply-ready-input, a second input coupled to the voltage divider output, and an output coupled to the power ready indicator output;
wherein the comparator is configured to generate the power ready signal in response to the voltage at the voltage divider output exceeding the voltage at the second power-supply-ready-input;
wherein the voltage divider has a further input coupled to the power ready indicator output and wherein the voltage divider is configured to increase the divided voltage value in response to the power read indication signal being generated.

* * * * *